United States Patent
Saulheimer et al.

(10) Patent No.: US 10,886,086 B2
(45) Date of Patent: Jan. 5, 2021

(54) METHODS AND APPARATUSES FOR MONITORING THE FUNCTIONALITY OF REDUNDANTLY INTERCONNECTED CONTACTS

(71) Applicant: PEPPERL+FUCHS SE, Mannheim (DE)

(72) Inventors: Daniel Saulheimer, Rehweiler (DE); Friedrich Fuess, Dannstadt-Schauernheim (DE)

(73) Assignee: PEPPERL+FUCHS SE, Mannheim (DE)

( * ) Notice: Subject to any disclaimer, the term of this patent is extended or adjusted under 35 U.S.C. 154(b) by 0 days.

(21) Appl. No.: 16/063,627

(22) PCT Filed: Dec. 18, 2015

(86) PCT No.: PCT/EP2015/080505
§ 371 (c)(1),
(2) Date: Jun. 18, 2018

(87) PCT Pub. No.: WO2017/102025
PCT Pub. Date: Jun. 22, 2017

(65) Prior Publication Data
US 2018/0374665 A1    Dec. 27, 2018

(51) Int. Cl.
*H01H 47/00* (2006.01)
*G01R 31/327* (2006.01)
(Continued)

(52) U.S. Cl.
CPC ....... *H01H 47/002* (2013.01); *G01R 31/3278* (2013.01); *H01H 47/004* (2013.01); *H01H 50/08* (2013.01); *H01H 50/54* (2013.01)

(58) Field of Classification Search
CPC .... H01H 47/002; H01H 47/004; H01H 50/08; H01H 50/54; G01R 31/3278
See application file for complete search history.

(56) References Cited

U.S. PATENT DOCUMENTS 6,304,189 B1    10/2001    Koch et al.
6,525,526 B1 *   2/2003    De Gruyter ........ G01R 31/2805
                                              324/537
(Continued)

FOREIGN PATENT DOCUMENTS

DE    102006027135 B3    9/2007
EP       2696502 A2       2/2014
(Continued)

OTHER PUBLICATIONS

International Searching Authority, International Search Report and Written Opinion for International Application No. PCT/EP2015/080505, dated Sep. 16, 2016, 11 pages, European Patent Office, Netherlands.
(Continued)

*Primary Examiner* — Brian A Zimmerman
*Assistant Examiner* — Kevin Lau
(74) *Attorney, Agent, or Firm* — Alston & Bird LLP (57) ABSTRACT

For providing a very simple and reliable monitoring of the functionality of contacts together with a high flexibility of selection of the contacts a method for monitoring the functionality of redundantly interconnected contacts is provided, preferably within a load current circuit, wherein said n contacts, n=2, provide an electrical connection between a power supply and a load, wherein said n contacts are switchable by a controller and wherein each of said n contacts is designed for providing the electrical connection between the power supply and the load all alone. The method is characterized in that the controller switches on said n contacts during n subsequent activations according to a defined schedule according to which at the first of said n subsequent activations one of said n contacts is switched on first and the remaining n−1 contacts are switched on afterwards, so that a verification regarding the functionality of (Continued)

said one of said n contacts is possible, and according to which at each of the n−1 remaining subsequent activations a further one of said n contacts is switched on first with switching on of the remaining n−1 contacts afterwards, so that after said n subsequent activations each of said n contacts has once been switched on first and a verification regarding the functionality of each of said n contacts is possible. Further, a corresponding method for subsequent deactivations and corresponding apparatuses are provided.

17 Claims, 5 Drawing Sheets

(51) Int. Cl.
*H01H 50/08* (2006.01)
*H01H 50/54* (2006.01)

(56) References Cited

U.S. PATENT DOCUMENTS

| | | | |
|---|---|---|---|
| 2012/0229938 A1* | 9/2012 | Boll | H01H 47/002 |
| | | | 361/42 |
| 2018/0005788 A1* | 1/2018 | Pullmann | G05B 9/03 |

FOREIGN PATENT DOCUMENTS

| | | |
|---|---|---|
| EP | 2800118 A1 | 11/2014 |
| GB | 2486493 A | 6/2012 |
| GB | 2486493 A | 6/2020 |
| WO | WO 2015/011531 A1 | 1/2015 |

OTHER PUBLICATIONS

Communication Pursuant to Article 94(3) EPC for European Patent Application No. 15823152.2, dated Jun. 24, 2020, (7 pages), European Patent Office, Munich, Germany.

* cited by examiner

METHODS AND APPARATUSES FOR MONITORING THE FUNCTIONALITY OF REDUNDANTLY INTERCONNECTED CONTACTS

CROSS REFERENCE TO RELATED APPLICATIONS

This application is a National Stage Application, filed under 35 U.S.C. 371, of International Application No. PCT/EP2015/080505, filed Dec. 18, 2015; the contents of which as are hereby incorporated by reference in their entirety.

BACKGROUND

Related Field

The present invention relates to methods for monitoring the functionality of redundantly interconnected contacts, preferably within a load current circuit, wherein said n contacts, n=2, . . . , provide an electrical connection between a power supply and a load, wherein said n contacts are switchable by a controller and wherein each of said n contacts is designed for providing the electrical connection between the power supply and the load all alone. Further, the present invention relates to corresponding apparatuses for monitoring the functionality of redundantly interconnected contacts.

Generally, the present invention refers to the field of safety-related systems or safety-related communication systems, for example, wherein a reliable switching on and/or switching off of a function or load is necessary.

Description of Related Art

A method and apparatus for monitoring the functionality of redundantly interconnected contacts is known from US 2012/0229938 A1. This document shows a safety-related communication system with a safety relay with signal inputs of an input signal current circuit that connect the safety relay to a control device for monitoring the input signal circuit. The safety relay also includes at least two load outputs of a load current circuit for connecting to a load. Switching elements are connected in parallel and configured to switch the load current circuit on or off based on an activation signal or control signal at the input signal current circuit. A diagnostic device monitors faults in the load current circuit and/or the safety relay. A signaling device connected to the signal inputs provides an impedance for the input signal circuit. The impedance is tuned to the control device during a fault-free state and is detunable upon detection of a fault so as to signal the detected fault to the control device via the input signal current circuit.

Generally, for minimizing the risk in safety-related applications two basic concepts are used. The first one is an enhancement of availability by redundance. The second concept is based on a diagnosis of safety-critical functions.

Different application situations and fields frequently require the use of relays between load and programmable logic controller, PLC, within safety circuits. Redundantly interconnected relay channels or contacts are frequently used for minimizing the risk within safety related relays, i.e. each channel or contact provides the availability of the safety function all alone. However, a diagnosis of single redundant relays is often impeded by said redundance, as a failure of one of said channels or contacts does not automatically result in a failure of the function or application to be provided.

Further, positively driven contacts could be used for diagnosis. However, this results in a significant limitation regarding the selection of relays or contacts within an individual application to said positively driven contacts or relays.

Minimizing the risk by redundance provides the disadvantage that faults which are based on the same cause—common cause—can be still potentially dangerous for the load or function to be protected. An enhancement of redundance can provide a slight improvement of safety, however, due to a limited mounting space such an enhancement of redundancy is not always possible.

The use of positively driven contacts or relays provides usually an improvement, however, the realization of positively driven contacts or relays needs an enlarged mounting space and limits the selection possibilities regarding the components of the apparatus.

BRIEF SUMMARY

The known methods and apparatuses for monitoring the functionality of redundantly interconnected contacts need a complex circuit and frequently a large mounting space for providing a high level of risk minimization.

Thus, it is an object of the present invention to improve and further develop a method and an apparatus for monitoring the functionality of redundantly interconnected contacts for providing a very simple and reliable monitoring of the functionality of the contacts together with a high flexibility of selection of the contacts.

In accordance with the invention, the aforementioned object is accomplished by a method comprising the features of claim 1. The method is characterized in that the controller switches on said n contacts during n subsequent activations according to a defined schedule according to which at the first of said n subsequent activations one of said n contacts is switched on first and the remaining n−1 contacts are switched on afterwards, so that a verification regarding the functionality of said one of said n contacts is possible, and according to which at each of the n−1 remaining subsequent activations a further one of said n contacts is switched on first with switching on of the remaining n−1 contacts afterwards, so that after said n subsequent activations each of said n contacts has once been switched on first and a verification regarding the functionality of each of said n contacts is possible.

Further, the aforementioned object is accomplished by a method according to claim 2. This method is characterized in that the controller switches off said n contacts during n subsequent deactivations according to a defined schedule according to which at the first of said n subsequent deactivations n−1 of said n contacts are switched off first and the remaining contact is switched off afterwards, so that a verification regarding the functionality of said remaining contact is possible, and according to which at each of the n−1 remaining subsequent deactivations a further one of said n contacts is switched off afterwards with switching off of the remaining n−1 contacts before, so that after said n subsequent deactivations each of said n contacts has once been switched off after the remaining n−1 contacts and a verification regarding the functionality of each of said n contacts is possible.

Further, the aforementioned object is accomplished by an apparatus comprising the features of claim 14. This apparatus is characterized in that the controller is arranged for switching on said n contacts during n subsequent activations according to a defined schedule according to which at the first of said n subsequent activations one of said n contacts is switched on first and the remaining n−1 contacts are switched on afterwards, so that a verification regarding the functionality of said one of said n contacts is possible, and according to which at each of the n−1 remaining subsequent activations a further one of said n contacts is switched on first with switching on of the remaining n−1 contacts afterwards, so that after said n subsequent activations each of said n contacts has once been switched on first and a verification regarding the functionality of each of said n contacts is possible.

Further, the aforementioned object is accomplished by an apparatus according to claim 15. This apparatus is characterized in that the controller is arranged for switching off said n contacts during n subsequent deactivations according to a defined schedule according to which at the first of said n subsequent deactivations n−1 of said n contacts are switched off first and the remaining contact is switched off afterwards, so that a verification regarding the functionality of said remaining contact is possible, and according to which at each of the n−1 remaining subsequent deactivations a further one of said n contacts is switched off afterwards with switching off of the remaining n−1 contacts before, so that after said n subsequent deactivations each of said n contacts has once been switched off after the remaining n−1 contacts and a verification regarding the functionality of each of said n contacts is possible.

According to the invention it has first been recognized that it is not necessary to enhance the redundance or to use positively driven contacts or relays for providing a high level of safety in providing a function or application. Further, it has been recognized that a smart schedule of activation or deactivation processes can form the basis for solving the above object in a smart way. Regarding a schedule of n subsequent activations the controller switches on at the first of said n subsequent activations only one of said n contacts and switches on the remaining n−1 contacts afterwards. A corresponding verification regarding the functionality of said one of said n contacts is possible by monitoring whether the electrical connection is already activated after switching on the one of said n contacts or not until after switching on the remaining n−1 contacts. If the electrical connection is already activated after switching on the one of said n contacts, said one contact works without failure. However, if the electrical connection is provided not until after switching on the remaining n−1 contacts, the one of said n contacts has a malfunction. During the following n−1 subsequent activations a further one of said n contacts is switched on first with switching on of the remaining n−1 contacts afterwards. Thus, after said n subsequent activations each of said n contacts has once been switched on first and a verification regarding the functionality of each of said n contacts is possible.

Regarding the provision of the inventive method during a deactivation process the controller can switch off said n contacts during n subsequent deactivations according to a defined schedule. According to this schedule at the first of said n subsequent deactivations n−1 of said n contacts are switched off first and the remaining contact is switched off afterwards. Thus, a verification regarding the functionality of said remaining contact is possible by monitoring whether the electrical connection has been already deactivated after switching off the n−1 contacts of said n contacts or not until after switching off the remaining contact. If the electrical connection is deactivated not until after switching off the remaining contact, said remaining contact is working correctly, as it has provided the electrical connection until its switching off process. However, if the electrical connection has already been deactivated after switching off the n−1 contacts, the remaining contact does not work correctly, as it has not maintained the electrical connection until its switching off process.

During each of the n−1 remaining subsequent deactivations a further one of said n contacts is switched off afterwards with switching off of the remaining n−1 contacts before. Thus, after said n subsequent deactivations each of said n contacts has once been switched off after the remaining n−1 contacts and a verification regarding the functionality of each of said n contacts is possible.

The claimed apparatuses according to claims 14 and 15 provide the same advantages as the above mentioned methods.

As a result, the inventive methods and apparatuses provide a very simple and reliable monitoring of the functionality of the contacts together with a high flexibility of selection of the contacts, as respective circuits can be kept simple and the use of positively driven contacts or relays is not necessary. A high flexibility of selection of the contacts is possible for the user.

In a preferred embodiment the verification can comprise checking whether the contact provides a reliable switching on process regarding the electrical connection. In this way the functionality of the contact can be verified.

In a further preferred embodiment the verification can comprise checking whether the electrical connection is already activated after switching on the one of said n contacts or not until after switching on the remaining n−1 contacts. This kind of verification refers to a method wherein said n contacts are switched on during n subsequent activations.

It is understood that between two subsequent activations a deactivation is performed, possibly according to a usual activation/deactivation schedule of a user. Similarly, respective activations are performed during subsequent deactivations, possibly according to such a activation/deactivation schedule of a user.

In a preferred embodiment of a method comprising n subsequent deactivations the verification can comprise checking whether the contact provides a reliable switching off process regarding the electrical connection. Thus, correct functioning of a contact can be verified.

In a further preferred embodiment the verification can comprise checking whether the electrical connection is already deactivated after switching off the n−1 contacts of said n contacts or not until after switching off the remaining contact. If the electrical connection is deactivated not until after switching off the remaining contact, this remaining contact works correctly.

Within a further preferred embodiment a control signal, an indication or an activity can be provided depending on the result of the verification. If the verification indicates that the contact is reliably functioning, a corresponding positive control signal or indication can be provided to a user. Usually, a further activity is not necessary in this case, as the contact functions in the necessary way. However, if the result of the verification is a malfunctioning or not functioning contact, a warning control signal or indication can be provided so that monitoring users can react accordingly by possibly stopping the safety function or load and/or the process of subsequent activations or deactivations, for example until a malfunctioning contact is replaced by a functioning contact.

In a preferred embodiment the control signal, the indication or the activity can be provided immediately after a detection of a malfunction or failure of a contact. Thus, a usually provided safety level can be maintained by an immediate repair or replacement of a malfunctioning contact by a correctly functioning contact.

In an alternatively preferred embodiment the control signal, the indication or the activity can be provided after said n subsequent activations or deactivations, if a malfunction or failure of any contact is detected by the verification. In this case, a reduced safety level has to be accepted, as at least one contact is not working correctly.

Depending on the individual situation the control signal can be an optical, acoustical or electronic control signal. An optical signal could be a warning illumination. An acoustical signal could be an alarm horn. An electronic control signal could be an electric or electronic pulse which can be provided to further electronic or mechanical equipment.

Within a preferred embodiment the contacts can be relay contacts. Various embodiments of relay contacts can be selected depending on the individual application situation or load.

Within a further preferred embodiment the controller can be a programmable logic controller. Such controllers are suitable for providing necessary switching series according to definable switching schedules.

Within a further preferred embodiment the power supply and load can be electrically or galvanically isolated from the controller. Such an embodiment is suitable for potentially explosive environments, for example in the field of mining or refinery.

The present invention provides a method and apparatus for performing monitoring or diagnosis of the functionality of redundantly interconnected contacts on the basis of subsequent activations or deactivations according to a defined schedule. Monitoring or diagnosis of each of n single channels or contacts is possible.

By means of a smart schedule of activations or deactivations said schedule provides a schedule comprising only a delay of the secure provisioning of the electrical connection or load or function of the load. No further adverse reaction or disadvantage has to be accepted.

As such a delay is short in comparison with a perceptible reaction time in the field, it is neglectable with regard to the safety function or function realized by the load.

By a delayed switching on of n−1 channels or contacts the remaining channel or contact can be verified or checked regarding its functionality within the delay time. The delay is switched to all channels or contacts in a way that after n switching on processes each channel or contact has switched once without time delay and could be checked in this way.

During a deactivation schedule comprising directly switching off of n−1 channels or contacts and delayed switching off of one channel or contact, said channel or contact can be verified regarding its functionality during the time delay. The delay is switched to all channels or contacts in a way that after n switching off processes each channel or contact has once been switched off with a delay and thus could be checked.

In comparison to a solution with high redundance the present invention provides the possibility of a similar risk minimization comprising less circuit complexity and frequently a resulting saving of mounting space.

By the use of standard relays a higher flexibility can be provided in comparison with a solution comprising positively driven contacts or relays.

As a verification or checking can be performed during a switching process, no additional inputs for a separate verification process have to be performed. Further, the verification or checking can be automatized in a way that no particular measurement at the device or apparatus has to be performed by a user. A corresponding feedback can be provided by a corresponding evaluation process and/or device.

The monitoring or diagnosis can be performed during a switching process or schedule and no further activity or measurement has to be performed by a user.

BRIEF DESCRIPTION OF THE FIGURES

There are several ways how to design and further develop the teaching of the present invention in an advantageous way. To this end it is to be referred to the patent claims subordinate to patent claims 1 and 2 on the one hand and to the following explanation of preferred embodiments of the invention, by way of example, illustrated by the figures on the other hand. In connection with the explanation of the preferred embodiments of the invention by the aid of the figures, generally preferred embodiments and further developments of the teaching will be explained. In the drawing

DETAILED DESCRIPTION OF VARIOUS EMBODIMENTS

Figure 1:
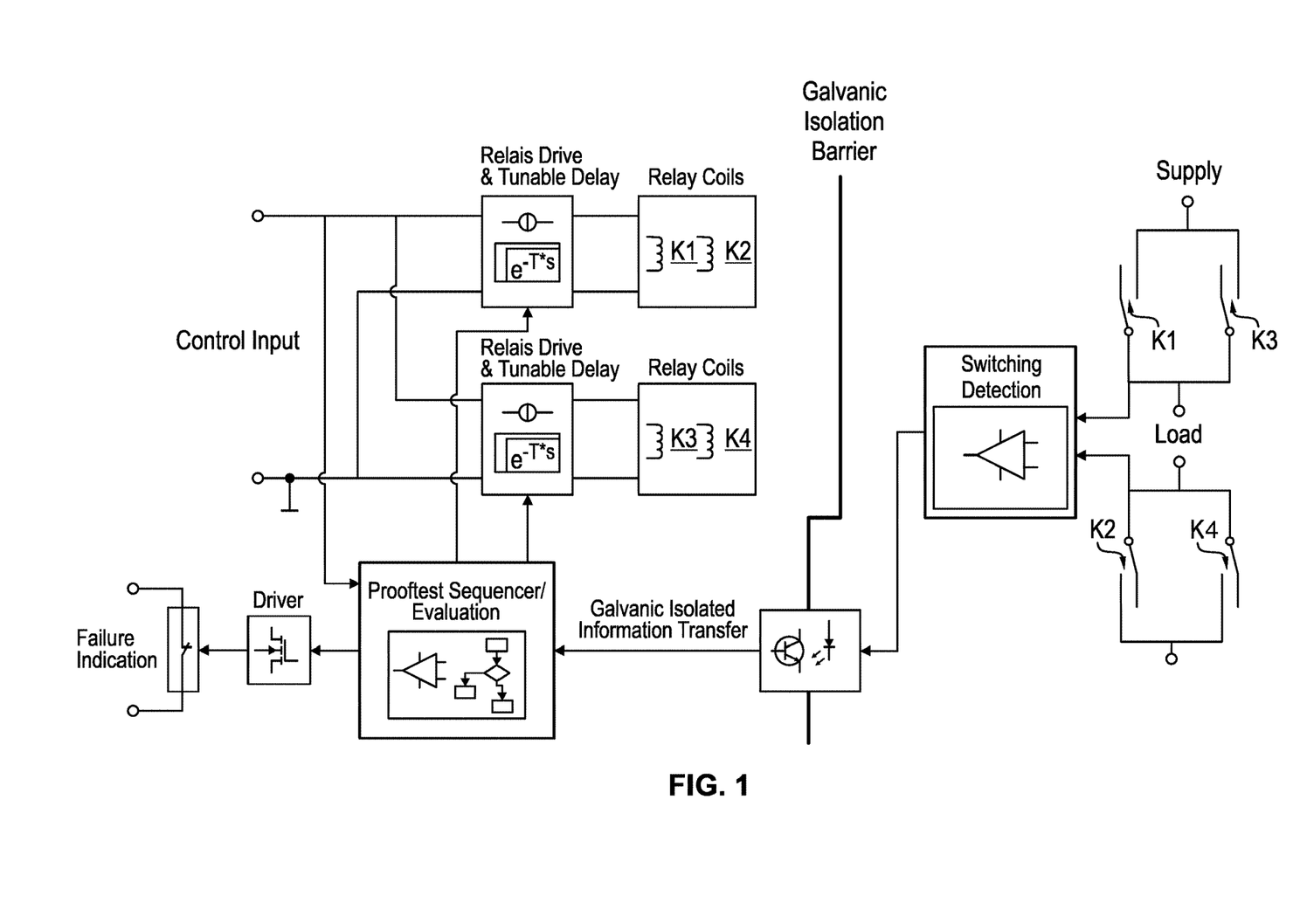
FIG. 1 is a block diagram illustrating a method and an apparatus according to an embodiment of the invention with n=2 redundant channels or contacts to be securely activated.

FIG. 1 shows within a block diagram an illustration of a method and/or an apparatus according to an embodiment of the invention. Within this embodiment n=2 redundant channels are realized for an all-pole switching on process, wherein channel CH1 is realized with switches K1 and K2 which are activated by relay coils for switch K1 and switch K2. Channel CH2 is realized with switches K3 and K4 which are energized by relay coils for these switches K3 and K4. The relay coils for activating the switches K1, K2, K3 and K4 are shown within the middle part of FIG. 1.

The arrangement within the left part of FIG. 1 is galvanically isolated from the arrangement within the right part of FIG. 1. The control input comprises relay drives with tunable delays for the switching or energizing of the relay coils. Switches K1, K2, K3 and K4 are provided for providing the electrical connection from a power supply to a load.

A switching detection circuit is provided nearby the switches K1 to K4. A galvanic isolated information transfer from said switching detection circuit is realized to a proof test sequencer/evaluation. The proof test sequencer/evaluation is connected to a driver and failure indicator. The failure indicator, driver and proof test sequencer/evaluation are galvanically isolated from the switching detection circuit.

Figure 2:
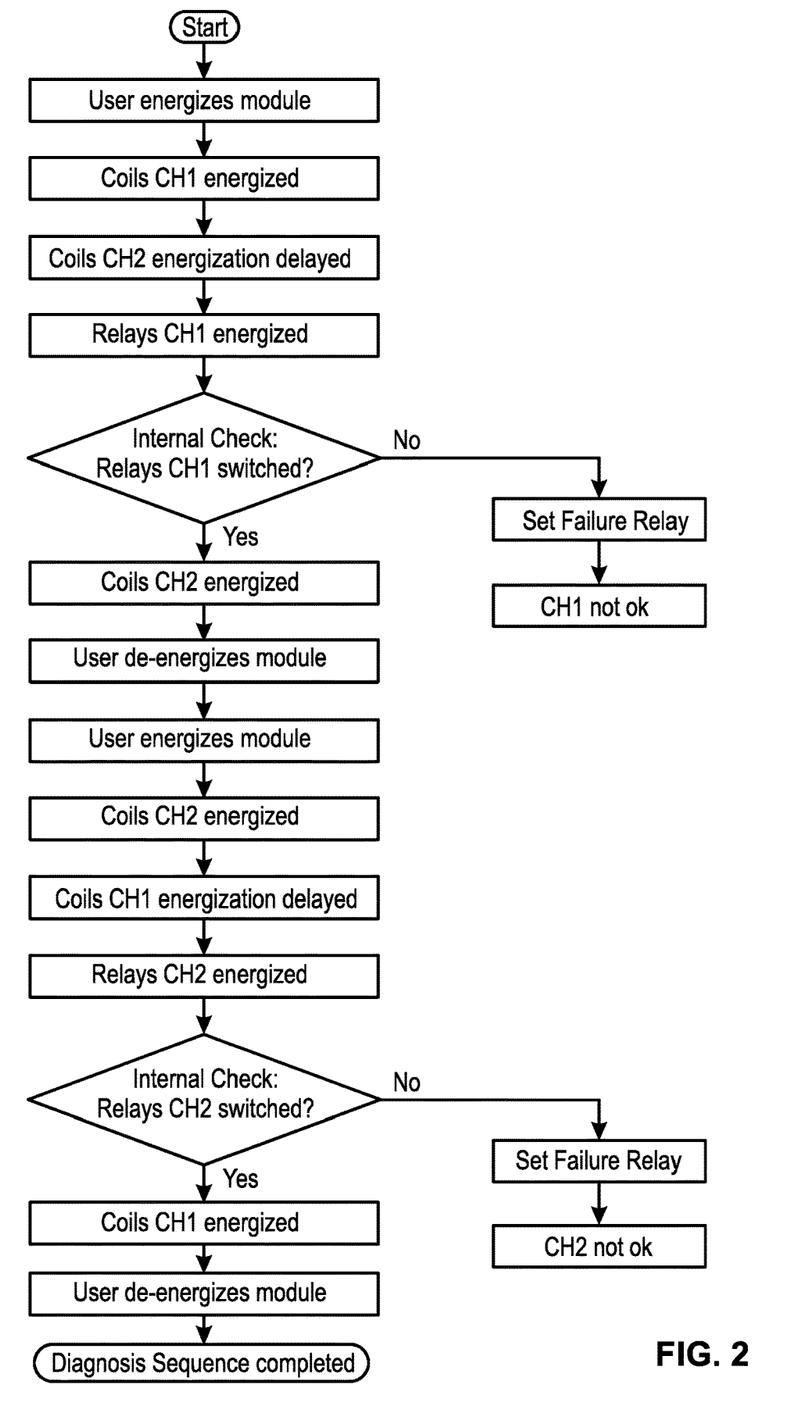
FIG. 2 is a block flow diagram illustrating an activation sequence for an apparatus or method according to FIG. 1.

FIG. 2 is a block flow diagram illustrating an activation sequence for an apparatus or method according to FIG. 1. At the start a user energizes the module and the coils for channel CH1 with the switches K1 and K2 are energized. The coils for the channel CH2 with the switches K3 and K4 are energized with a delay. As a result the relays of channel CH1 are energized. Now, an internal check is performed for verifying whether the relays for channel CH1 have switched.

After a deactivation by the user, the user again energizes the module. Then, the coils of channel CH2 are energized and the coils of channel CH1 are delayed. Now, a verification of functionality of the relays of channel CH2 is performed. Thus, both channels CH1 and CH2 are verified regarding functionality.

Within the above embodiment a channel CH1 is provided with switches K1 and K2 and a channel CH2 is provided with switches K3 and K4. Each channel CH1 or CH2 provides the electrical connection between the power supply and the load all alone. Thus, each channel CH1 or CH2 can be designated as a single redundant contact in a general way according to the present invention. In other words, a contact in the sense of the present invention is provided by each channel CH1 and CH2, so that the present embodiment comprises n=2 contacts for providing the electrical connection between the power supply and the load.

Figure 3:
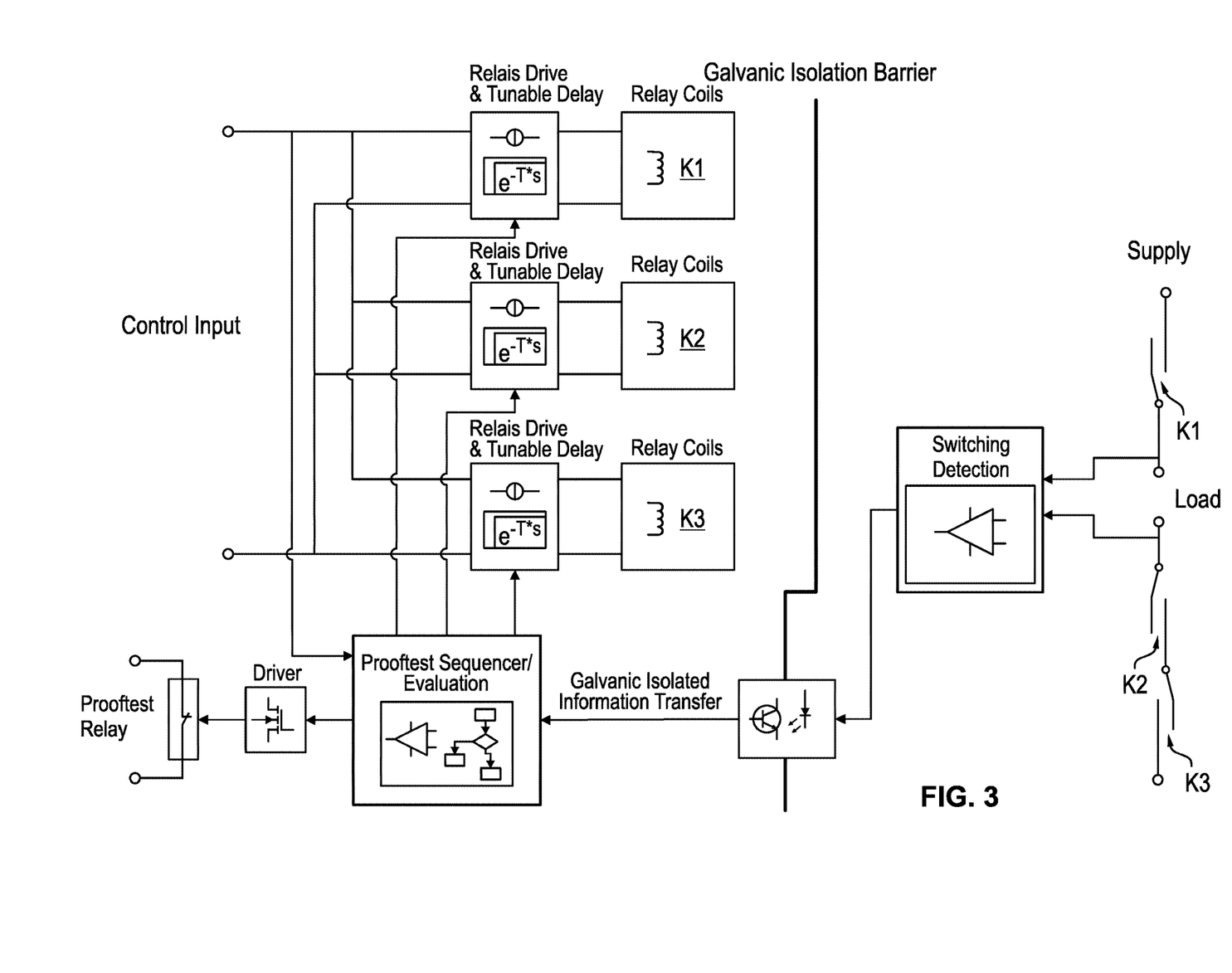
FIG. 3 is a block diagram illustrating a method and an apparatus according to an embodiment of the invention with n=3 redundant channels or contacts to be securely deactivated.

FIG. 3 is showing a block diagram illustrating a method and/or an apparatus according to a further embodiment of the present invention with n=3 redundant channels or contacts to be securely deactivated. Power supply and load are separated by a galvanic isolation barrier from the control input or controller. The embodiment according to FIG. 3 is showing the same switching detection, galvanic isolated information transfer, proof test sequencer/evaluation, driver and proof test relay or failure indicator like the embodiment of FIG. 1. However, there is provided one relay coil for each switch K1, K2 and K3. Thus, three relay coils are provided each being connected to a relay drive and tunable delay equipment of the controller.

After n=3 subsequent deactivations each of said n contacts has once been switched off after the remaining n−1 contacts and a verification regarding the functionality of each of said n contacts is possible.

Figure 4:
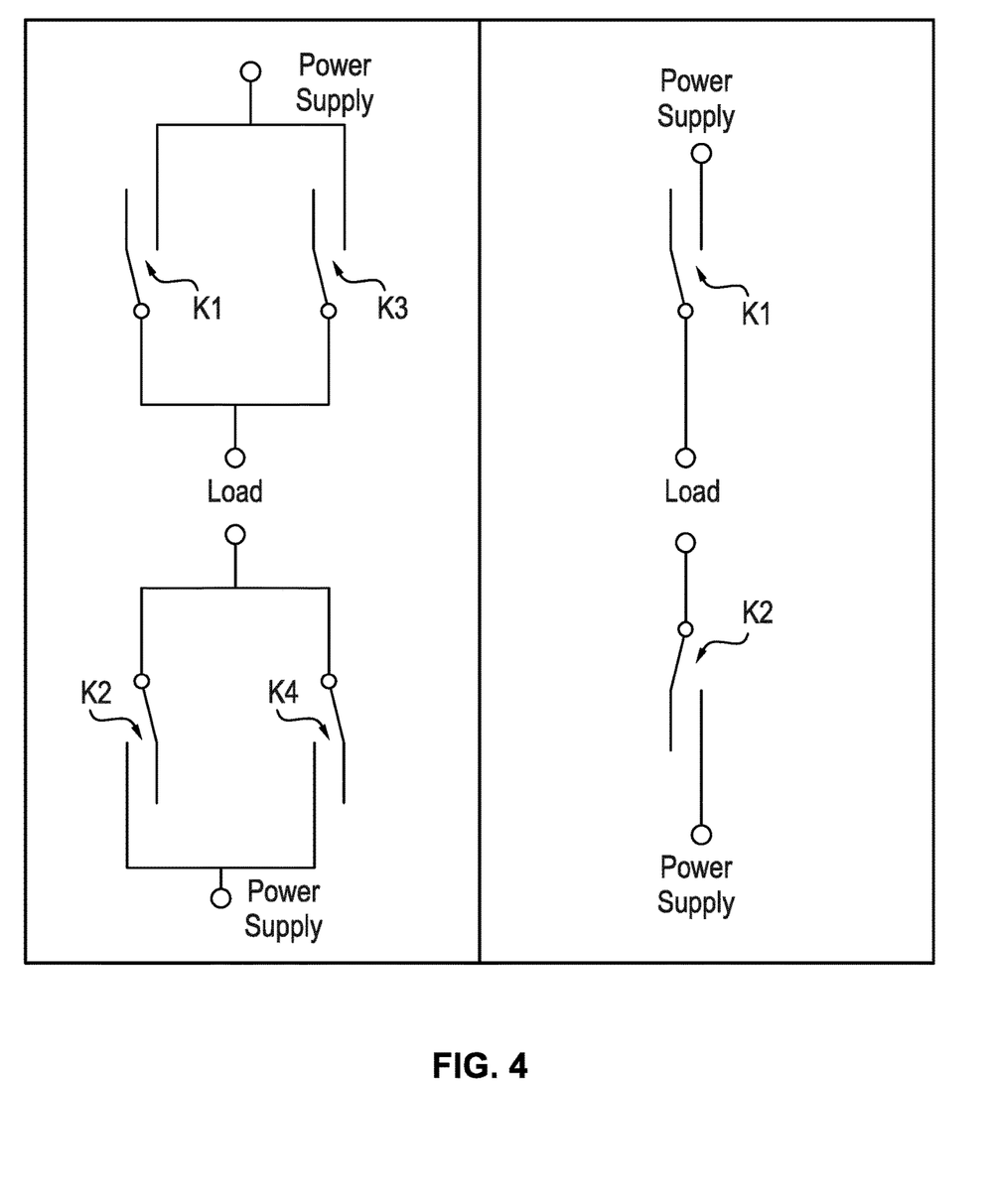
FIG. 4 is a schematic illustration of a known relay arrangement for securely activating—left side—and deactivating—right ride—an electrical connection and FIG. 5 is a schematic illustration of known positively driven contacts and a corresponding diagnosis circuit.

FIG. 4 is showing a schematic illustration of a known relay arrangement for securely activating—left side—and deactivating—right side—an electrical connection between a power supply and a load. The arrangement comprises switches K1 to K4 and K1 to K2 for providing redundance for a secure all-pole switching on and switching off.

Figure 5:
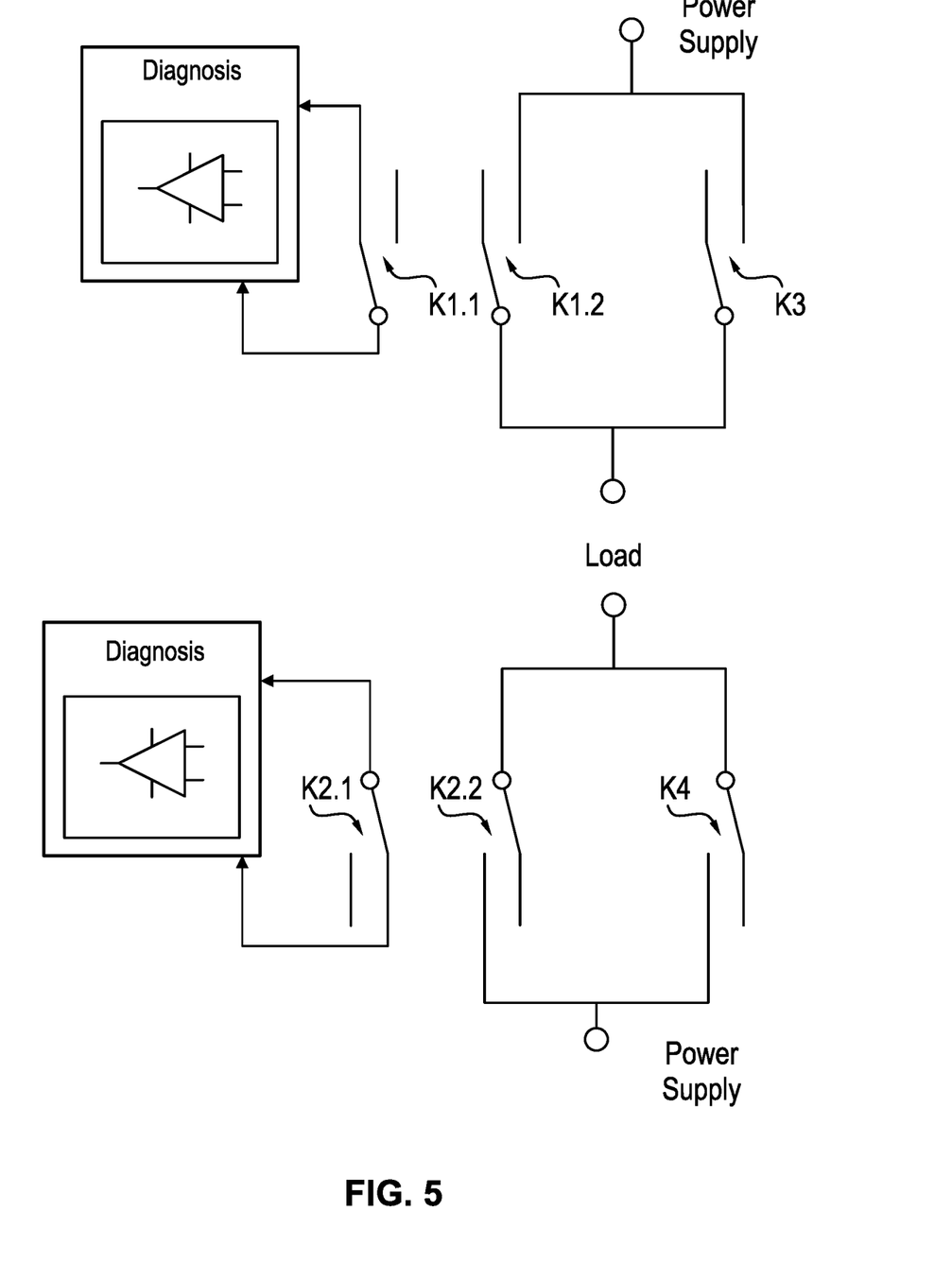

FIG. 5 shows a schematic illustration of a known arrangement with positively driven contacts. Switches K1.1 and K1.2 as well as switches K2.1 and K2.2 are positively driven. Switches K3 and K4 provide redundance. Positively driven contacts or switches are subject to wear with possibly bent or broken electrical contacts. Further, positively driven contacts need a large mounting space.

Many modifications and other embodiments of the invention set forth herein will come to mind to the one skilled in the art to which the invention pertains having the benefit of the teachings presented in the foregoing description and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

LIST OF REFERENCE SIGNS

K1 Switch
K1.1 Switch
K1.2 Switch
K2 Switch
K2.1 Switch
K2.2 Switch
K3 Switch
K4 Switch
CH1 Channel 1
CH2 Channel 2

The invention claimed is:

1. Method for monitoring the functionality of n contacts, wherein said n contacts comprise at least three redundantly interconnected contacts that each provide an electrical connection between a power supply and a load, wherein said n contacts are switchable by a controller and wherein each of said n contacts is designed for providing the electrical connection between the power supply and the load all alone, wherein the method comprises the steps of:
   switching on, via the controller, said n contacts during n subsequent activations according to a defined schedule according to which at the first of said n subsequent activations only one of said n contacts is switched on first and the remaining n−1 contacts are collectively switched on afterwards, so that a verification regarding the functionality of said one of said n contacts is possible, and
   at each of the n−1 remaining subsequent activations, switching on first, via the controller, only a further one of said n contacts with collective switching on of all the remaining n−1 contacts afterwards, so that after said n subsequent activations each of said n contacts has once been switched on alone and first for an independent verification regarding the functionality of each of said n contacts.

2. Method for monitoring the functionality of n contacts, wherein said n contacts comprise at least three redundantly interconnected contacts that each provide an electrical connection between a power supply and a load, wherein said n contacts are switchable by a controller and wherein each of said n contacts is designed for providing the electrical connection between the power supply and the load all alone, wherein the controller switches off said n contacts during n subsequent deactivations according to a defined schedule according to which at the first of said n subsequent deactivations n−1 of said n contacts are collectively switched off first and the only remaining contact is switched off afterwards, so that a verification regarding the functionality of said only remaining contact is possible, and according to which at each of the n−1 remaining subsequent deactivations a further one of said n contacts is switched off afterwards with collective switching off of the remaining n−1 contacts before, so that after said n subsequent deactivations each of said n contacts has once been switched off alone and after the remaining n−1 contacts for an independent verification regarding the functionality of each of said n contacts.

3. Method according to claim 1, wherein the verification comprises checking whether the contact provides a reliable switching on process regarding the electrical connection.

4. Method according to claim 1, wherein the verification comprises checking whether the electrical connection is already activated after switching on the one of said n contacts or not until after switching on the remaining n−1 contacts.

5. Method according to claim 1, wherein the verification comprises checking whether the contact provides a reliable switching off process regarding the electrical connection.

6. Method according to claim 1, wherein the verification comprises checking whether the electrical connection is already deactivated after switching off the n−1 contacts of said n contacts or not until after switching off the remaining contact.

7. Method according to claim 1, wherein depending on the result of the verification a control signal, an indication or an activity is provided.

8. Method according to claim 7, wherein the control signal, the indication or the activity is provided immediately after a detection of a malfunction or failure of a contact.

9. Method according to claim 7, wherein the control signal, the indication or the activity is provided after said n subsequent activations or deactivations, if a malfunction or failure of a contact is detected by the verification.

10. Method according to claim 7, wherein the control signal is an optical, acoustical or electronic control signal.

11. Method according to claim 1, wherein the contacts are relay contacts.

12. Method according to claim 1, wherein the controller is a programmable logic controller.

13. Method according to claim 1, wherein the power supply and load are electrically or galvanically isolated from the controller.

14. Apparatus comprising a controller configured for performing the method according to claim 1.

15. Apparatus comprising a controller configured for performing the method according to claim 2.

16. Method according to claim 1, wherein the method is conducted within a load current circuit.

17. Method according to claim 2, wherein the method is conducted within a load current circuit.

* * * * *

UNITED STATES PATENT AND TRADEMARK OFFICE
CERTIFICATE OF CORRECTION

PATENT NO. : 10,886,086 B2  
APPLICATION NO. : 16/063627  
DATED : January 5, 2021  
INVENTOR(S) : Daniel Saulheimer et al.

Page 1 of 1

It is certified that error appears in the above-identified patent and that said Letters Patent is hereby corrected as shown below:

In the Claims

Claim 5, Line 1, change "1" to --2--.

Claim 6, Line 1, change "1" to --2--.

Signed and Sealed this  
Nineteenth Day of October, 2021

Drew Hirshfeld  
*Performing the Functions and Duties of the*  
*Under Secretary of Commerce for Intellectual Property and*  
*Director of the United States Patent and Trademark Office*